US006660548B2

(12) United States Patent
Naydenkov et al.

(10) Patent No.: US 6,660,548 B2
(45) Date of Patent: Dec. 9, 2003

(54) PACKAGING OF MULTIPLE ACTIVE OPTICAL DEVICES

(75) Inventors: Mikhail Naydenkov, Los Angeles, CA (US); Sivasubramaniam Yegnanarayanan, Oak Park, CA (US); Quyen Huynh, Garden Grove, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/109,166

(22) Filed: Mar. 27, 2002

(65) Prior Publication Data

US 2003/0186476 A1 Oct. 2, 2003

(51) Int. Cl.[7] ............................................. G01R 31/26
(52) U.S. Cl. ...................................................... 438/26
(58) Field of Search ............................. 438/26, 28, 27, 438/25, 55, 612, 613; 257/777, 719

(56) References Cited

U.S. PATENT DOCUMENTS 6,489,687 B1 * 12/2002 Hashimoto .................. 257/777

OTHER PUBLICATIONS

Baggerman et al., Reliable Au–Sn Flip Chip Bonding on Flexible Prints, 1994, pp. 900–905.*

Pittroff et al., Mounting of High Power Laser Diodes on Boron Nitride Heat Sinks using an Optimized Au/Sn Metallurgy, 2000, pp. 119–124.*

* cited by examiner

*Primary Examiner*—Long Pham
*Assistant Examiner*—Hoa B. Trinh
(74) *Attorney, Agent, or Firm*—Balkely, Sokoloff, Taylor & Zafman LLP

(57) ABSTRACT

A cost effective method is provided for assembly of hybrid optoelectronic circuits requiring flip-chip bonding of multiple active optoelectronic devices onto common substrate or optical bench platform with fine pitch and high accuracy "after-bonding" alignment to the alignment features on substrate and/or to other elements of the hybrid circuit. A Flip-Chip Bonder equipped with high precision Bonding Arm and optical and mechanical system, heated substrate chuck and heated pick-up tool may be used both for alignment and thermal bonding of active component dies to corresponding bonding pads on the common substrate using gold-tin (Au—Sn) solder disposed between die bonding pad and the corresponding substrate bonding pad. During bonding of the first die, tin (Sn) diffuses from a eutectic composition of gold-tin (Au—Sn) solder to (gold (Au) on) the die-bonding pad and/or (gold (Au) on) the substrate bonding-pad resulting in transformation of the Au—Sn eutectic composition to a zeta-phase composition having much higher melting temperature as compared to that of a eutectic composition. As bonding of one or more subsequent dies is performed at temperatures equal to or slightly higher than the melting temperature of a eutectic composition and significantly lower than the melting temperature of a zeta-phase composition, the gold-tin (Au—Sn) solder at the bond of previously attached die does not melt and, consequently, the alignment is not compromised.

21 Claims, 6 Drawing Sheets

PACKAGING OF MULTIPLE ACTIVE OPTICAL DEVICES

CROSS REFERENCE TO RELATED APPLICATIONS

The present application is related to U.S. patent application Ser. No. 10/061,981, filed Jan. 31, 2002 entitled "Method to Realize Fast Silicon-On-Insulator (SOI) Optical Device," with inventors Sivasubramaniam Yegnanarayanan and Mikhail Naydenkov.

BACKGROUND OF THE INVENTION

1. Field of the Invention

The present invention is related to photonic devices and, in particular to hybrid integrated optoelectronic circuits and optical packaging 2. Background Information Hybrid integrated optoelectronic circuits are commonly fabricated using discrete active and passive photonic devices and electronic devices. Active photonic devices commonly include edge-emitting lasers such as Fabry-Perot (FP) & distributed feedback lasers (DFB), vertical cavity surface-emitting lasers (VCSEL), electro-absorption modulated lasers (EML), photodetectors, semiconductor optical amplifiers, electro-absorption modulators, and other discrete photonic devices. Active optoelectronic (photonic) devices could be combined on the same chip with electronic circuits (devices), for example laser diode and laser driver circuit, and/or photodetector and transimpedance amplifier could be integrated on one chip. At the same time discrete photonic and electronic devices could be bonded to a common substrate, which provides electrical and optical interconnects for the devices. Passive photonic components include guided wave optical elements and optical fibers. Passive photonic components include 1×N (N=2,4,8,16) optical splitters, combiners, wavelength division multiplexed (WDM) or coarse-wavelength division multiplexers or demultiplexers (CWDM/wideband WDM), variable optical attenuators. To fabricate hybrid optoelectronic circuits, passive and active photonic devices typically are formed in a chip substrate using chemical processes and/or are bonded to the substrate using solders or epoxies.

In the prior art, light is coupled from separately packaged photonic devices into optical fibers and then coupled from the optical fibers to separately packaged waveguide devices. To ensure optimal coupling of light, each photonic device is aligned with its associated optical fiber and each optical fiber is aligned with its corresponding input waveguide of guided wave device.

One alignment technique involves a self-alignment in which the surface tension force of melted solder pulls each optoelectronic component being bonded to common substrate (or optical bench) into alignment position and when cooled the solder provides mechanical and electrical connection of the optoelectronic component (e.g., laser) die to a bonding pad on the common substrate. In some instances, micro-machined mechanical stops further refine the alignment in that they restrict the movement of the discrete components.

Another technique involves active alignment, which involves, for example, powering the laser so that it emits light, coupling the light into a waveguide, and monitoring optical power at the output of the waveguide to determine whether light was coupled efficiently. This is a widely used technique for packaging lasers/photodetectors with optical fiber for telecom applications. The optoelectronic device (e.g., laser/photodetector) is fixed onto a ceramic substrate. Micro-optic components such as isolators and lens are then placed in front of the laser. The fiber is then welded into place after optimizing its position to achieve optimum (i.e., >50%) coupling of light between the optical fiber and the optoelectronic device by active alignment. Typically active alignment is a time-consuming, largely manual process that requires expensive equipment, resulting in the packaging dominating the cost of the optoelectronic module.

With the gradual migration of optical links from long-haul transport to the enterprise and eventually the desktop, there is a growing need for highly functional optical and optoelectronic components that occupy a small form-factor, and that are inexpensive. New optical packaging approaches need to be developed in order to address this need.

For instance, assembly of small form-factor multiple component hybrid optoelectronic devices requires flip-chip bonding of several active optoelectronic components with fine pitch and high after-bonding alignment accuracy. Currently there are volume manufacturing ready Flip-Chip Bonders that can place an optoelectronic die onto the two-dimensional surface of the substrate with placement accuracy of ±1 $\mu$m available, with much shorter cycle times compared to active alignment. In order for edge-emitter devices to couple to each other and onto optical fiber, similar accuracy is required for die placement in the vertical ("z") direction. To achieve alignment accuracy in the "z" direction, special mechanical pedestals are micro-machined on the substrate.

Such techniques offer the possibility of high accuracy active optoelectronic component die bonding without using active alignment or relying on self-alignment effect. However heating of the substrate during bonding of subsequent components (e.g., laser dies) can affect the alignment of the previously bonded components. That is, the cooled (solidified) solder bond on the previously bonded component die melts when the substrate is heated to bond the next component die and the previously bonded die moves, thereby affecting its optical coupling to a passive waveguide on the substrate or coupling to/from optical fiber.

BRIEF DESCRIPTION OF THE DRAWINGS

In the drawings, like reference numbers generally indicate identical, functionally similar, and/or structurally equivalent elements. The drawing in which an element first appears is indicated by the leftmost digit(s) in the reference number, in which.

DETAILED DESCRIPTION OF THE ILLUSTRATED EMBODIMENTS OF THE PRESENT INVENTION

Embodiments of the present invention utilize unique properties of a gold-tin (Au—Sn) alloy system to electrically and mechanically bond active optoelectronic device dies to a substrate at different times without disturbing previously bonded dies. In the following description, numerous specific details, such as particular processes, materials, devices, and so forth, are presented to provide a thorough understanding of embodiments of the invention. One skilled in the relevant art will recognize, however, that the invention can be practiced without one or more of the specific details, or with other methods, components, etc. In other instances, well-known structures or operations are not shown or described in detail to avoid obscuring various embodiments of the present invention.

Some parts of the description will be presented using terms such as waveguide, silicon, solder, active optoelectronic device, multiplexer, eutectic, and so forth. These terms are commonly employed by those skilled in the art to convey the substance of their work to others skilled in the art.

Various operations will be described as multiple discrete blocks performed in turn in a manner that is most helpful in understanding the invention. However, the order in which they are described should not be construed to imply that these operations are necessarily order dependent or that the operations be performed in the order in which the blocks are presented.

Reference throughout this specification to "one embodiment" or "an embodiment" means that a particular feature, structure, process, block, or characteristic described in connection with the embodiment of the present invention is included in at least one embodiment of the present invention. Thus, the appearances of the phrases "in one embodiment of the present invention" or "in an embodiment of the present invention" in various places throughout this specification are not necessarily all referring to the same embodiment of the present invention. Furthermore, the particular features, structures, or characteristics may be combined in any suitable manner in one or more embodiments of the present invention.

Figure 1:
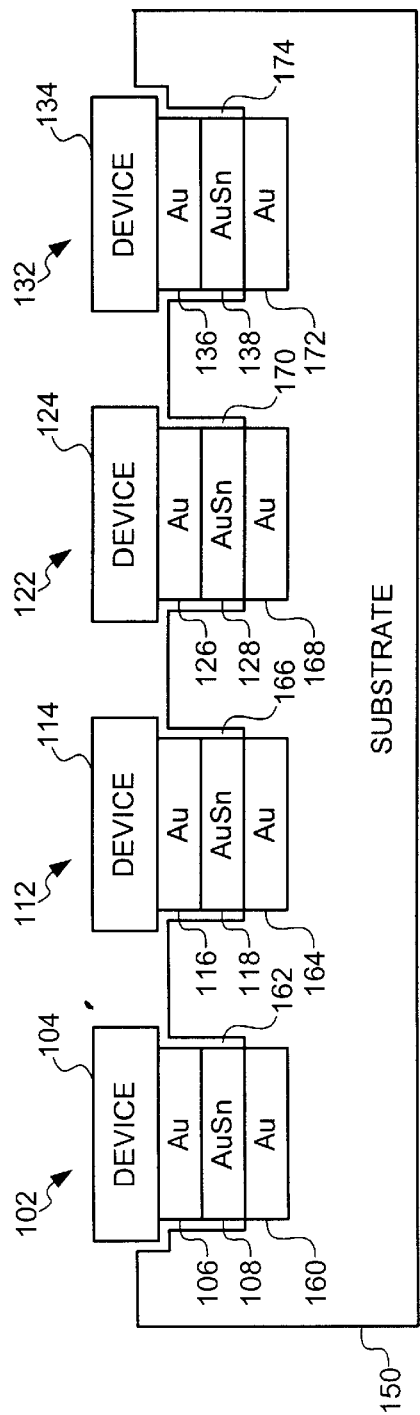
FIG. 1 is a cross-section view of a hybrid optical circuit prior to bonding active optoelectronic device dies to a substrate according to an embodiment of the present invention.

FIG. 1 is a cross-section view of a hybrid optical circuit 100, prior to bonding components to a substrate or optical bench, according to an embodiment of the present invention. In the illustrated embodiment of the present invention, the hybrid optical circuit 100 includes a set of active optoelectronic device dies (102, 112, 122, 132). Each die (102, 112, 122, 132) includes an active optoelectronic device (104, 114, 124, 134, respectively) and a gold-layered (Au) die bonding pad (106, 116, 126, 136, respectively) disposed on the device (104, 114, 124, 134, respectively).

In one embodiment of the present invention, A gold-tin (Au—Sn) solder layer (108, 118, 128, 138, respectively) may be disposed on the die bonding pad (106, 116, 126, 136, respectively). In one embodiment of the present invention, the Au—Sn solder layers (108, 118, 128, 138) are eighty percent gold (Au) by weight and twenty percent tin (Sn) by weight (80%wt/20%wt Au—Sn).

The hybrid optical circuit 100 includes a substrate 150, which has a gold-layered (Au) substrate bonding pads (160, 164, 168, 172) disposed in a well (162, 166, 170, 174, respectively). Each die (102, 112, 122, 132) is aligned to alignment marks on the bottom of a substrate well (162, 166, 170, 174, respectively), positioned on top of a substrate well (162, 166, 170, 174, respectively) so that the die bonding pad (106, 116, 126, 136, respectively), the solder layer (108, 118, 128, 138, respectively), and the substrate bonding pads (160, 164, 168, 172, respectively) are in mechanical contact. Each die (102, 112, 122, 132) is bonded to the substrate 150 using a die bonding pad (106, 116, 126, 136, respectively), the Au—Sn solder layer (108, 118, 128, 138, respectively), and the substrate bonding pad (160, 164, 168, 172, respectively), for example, in such a manner that after-bonding alignment is better than ±2 micron.

In an alternative embodiment of the present invention, the gold-tin (Au—Sn) solder layer (108, 118, 128, 138, respectively) may be disposed on the substrated-bonding pad (160, 164, 168, 172, respectively), rather than or in addition to being disposed on a die-bonding pad (106, 116, 126, 136, respectively). The active optoelectronic devices (104, 114, 124, 134) also may be aligned to waveguides (shown in FIG. 8) also disposed on the substrate 150 so that optical mode of the active optoelectronic device (104, 114, 124, 134) is efficiently coupled to optical mode of the waveguide.

According to an embodiment of the present invention, the active optoelectronic device dies (102, 112, 122, 132) may be edge-emitting laser dies, vertical cavity surface-emitting laser dies (VCSEL), photodetector dies, semiconductor optical amplifier dies, and other discrete photonic device dies with devices that generate light when stimulated, that sense light, convert light to electrical signals, or that condition light. The active optoelectronic devices dies (104, 114, 124, 134) may have different operating wavelengths.

The substrate 150 (or optical bench) may be a silicon substrate, a silicon-on insulator (SOI) substrate, or other suitable substrate that provides good electrical and thermal properties for the placement of the optoelectronic die. For example, when the substrate is an SOI substrate an insulator layer of silicon oxide (e.g., $SiO_2$, glass) may be formed (e.g., by growing, implanting, bonding, etc.) on an intrinsic silicon (Si) substrate in a well-known manner. An intrinsic Si layer may be formed on the insulator layer.

The SOI substrate may be a bond-and-etchback-silicon-on-insulator (BESOI) substrate, which is obtained by growing $SiO_2$ on the two Si wafers and bonding the Si wafers together by wafer fusion. The top Si wafer is subsequently thinned to the desired thickness. The SOI substrate may be separation-by-implanted-oxygen (SIMOX) SOI substrate, which is obtained by implanting oxygen at a well-defined depth (controlled by implant energy) into silicon and annealing the silicon to form a buried $SiO_2$ (BOX) layer.

The substrate 150 may be micro-machined in accordance with well-known techniques to form the substrate wells (162, 166, 170, 174). For example, the substrate 150 may be dry etched to form the substrate wells (162, 166, 170, 174).

Figure 2:
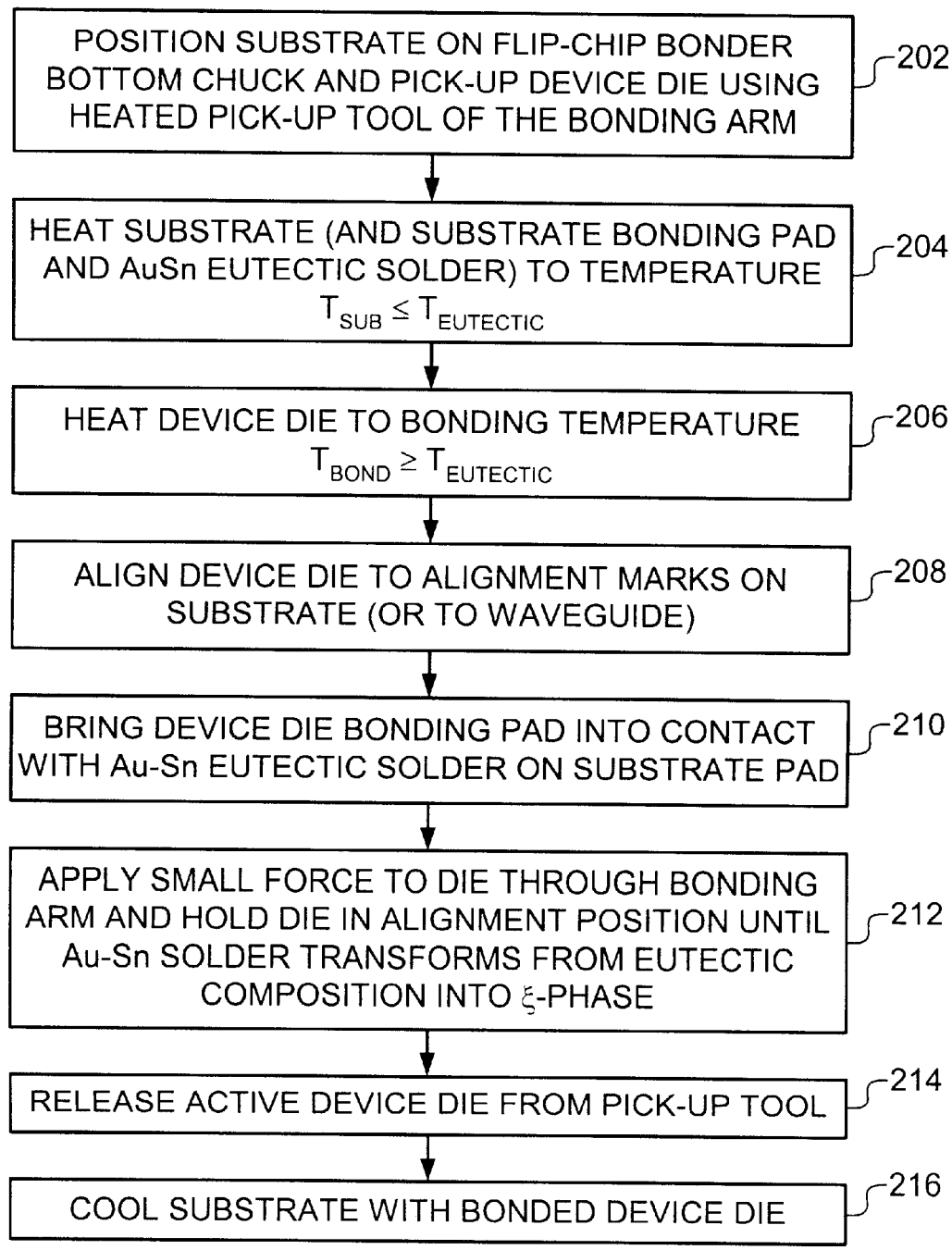
FIG. 2 is a flowchart illustrating an approach to bonding active optoelectronic device dies in FIG. 1 to the substrate in FIG. 1 according to embodiments of the present invention.

FIG. 2 is a flowchart illustrating an example method 200 for mechanically and electrically bonding dies to a substrate according to embodiments of the present invention. In one embodiment of the present invention, the dies are bonded to the substrate with after-bonding accuracy better than ±2 microns. This after-bonding alignment accuracy is sufficient to efficiently couple light into and/or out of various photonic devices when alignment tolerances between optical devices are relaxed using special input/output optical structures such as mode-taper structures. In addition, this tolerance would be sufficient for low-coupling applications in short-reach optical links.

The dies may be bonded to the substrate using a flip-chip bonder. A suitable flip-chip bonder includes a bottom chuck, a bonding arm, a heated pick-up tool, "x"-"y" positioners, and optical viewing system. A suitable flip-chip bonder may be a proprietary flip-chip bonder or one available from FINETECH in Berlin, Germany. A machine-readable medium with machine-readable instructions thereon may be used to cause a processor to perform the process 200.

In a block 202, a substrate is positioned on the bottom chuck of the flip-chip bonder and the heated pick-up tool picks up a die.

A block 204 heats the substrate and the substrate bonding pad to a temperature less than or equal to the eutectic temperature of an Au—Sn alloy solder. As used herein, the term "eutectic" refers to a structure, temperature, and/or phase of an alloy system characterized by equilibrium between solid state and liquid state. Alloys of eutectic composition completely (100%) transform into liquid phase when heated above the eutectic temperature and completely (100%) transforms into solid phase when cooled below the eutectic temperature. For example, a common eutectic Au—Sn solder composition has eighty percent gold (Au) by weight and twenty percent tin (Sn) by weight (i.e., 80%wt/20%wt Au—Sn solder), but can be in the eutectic range depicted in phase equilibrium graphical representation for a gold-tin (Au—Sn) alloy system shown in FIG. 4 below.

When heating the substrate and the substrate-bonding pad, a computer may control the flow of a hot inert (or forming) gas when used to reduce oxidation on the bonding interface between the substrate and the die. The inert gas may be nitrogen. Generally, a forming gas is a mixture of hydrogen and nitrogen and is used to render the inert atmosphere while bonding die to substrate.

A block 206 heats the die to a temperature greater than or equal to the eutectic temperature of eutectic Au—Sn alloy solder, which also causes the eutectic Au—Sn alloy solder to begin to melt.

A block 208 aligns the die with alignment marks on the substrate or with a waveguide formed in or on the substrate. In one embodiment of the present invention, the die is aligned using the "x"-"y" positioners and the optical viewing system. Unique alignment marks/features may be implemented on the top-layer metallization in the die and the substrate to facilitate machine-vision based rapid alignment between the die and substrate. Such techniques are well known and widely used for flip-chip packaging of optoelectronic die onto substrate.

In a block 210, the heated pick-up tool brings the die-bonding pad into contact with a eutectic gold-tin (AuSn) solder layer on the substrate pad.

In a block 212, the bonding arm applies a small force to the die and holds the die in the alignment position until the gold-tin (Au—Sn) solder layer on the gold (Au) substrate-bonding pad transforms from a eutectic composition to zeta-phase (ξ-phase). As used herein, the term "zeta-phase" refers to a structure, temperature, and/or phase of an alloy system characterized by spontaneous local freezing during the bonding process. Zeta-phase transforms directly from a solid phase to a liquid phase when heated up to a temperatures above the "liquidus" line of the phase equilibrium graphical representation for a gold-tin (Au—Sn) alloy system depicted in FIG. 4 below and transforms directly into a solid phases when cooled down to a temperature below "solidus" line of the phase equilibrium graphical representation for a gold-tin (Au—Sn) alloy system depicted in FIG. 4 below. For example, a common zeta-phase Au—Sn solder composition has eighty-eight percent gold (Au) by weight and twelve percent tin (Sn) by weight (i.e., 88%wt/12%wt Au—Sn solder), but can be in the zeta-phase range depicted in phase equilibrium graphical representation for a gold-tin (Au—Sn) alloy system depicted in FIG. 4 below.

In the block 212, Sn from the gold-tin (Au—Sn) solder layer will diffuse into gold (Au) on the die-bonding pad and the gold (Au) on the substrate-bonding pad, and the gold-tin (Au—Sn) solder layer begins to "consume" gold (Au) from the die-bonding pad and the substrate-bonding pad. The die is positioned in the "z" direction using the micro-machined pedestals (or mechanical stops). When the solder is melted the bonding arm forces the die against its respective pedestal.

Figure 4:
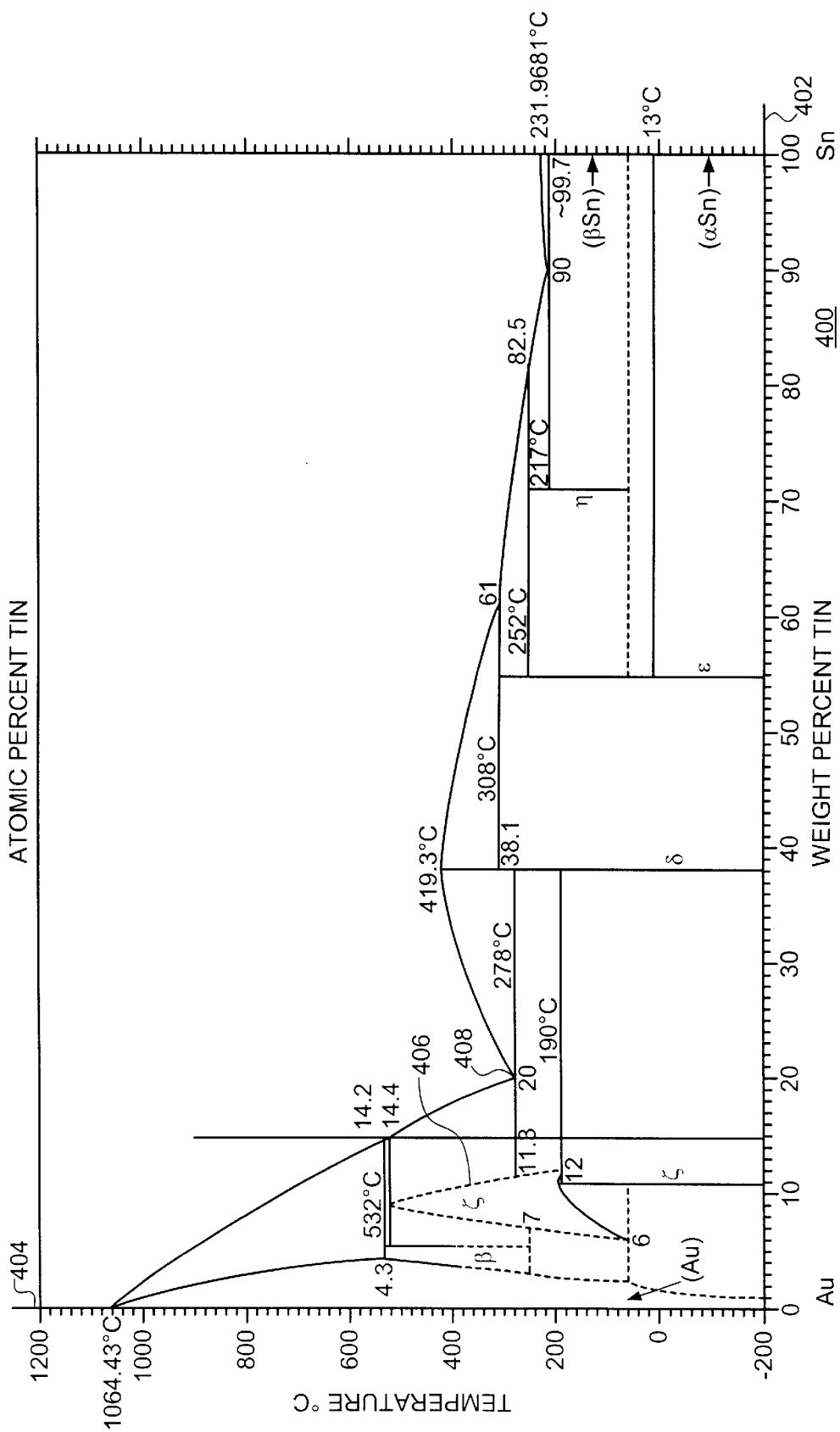
FIG. 4 is a graphical representation of the phase equilibrium for a gold-tin (Au—Sn) alloy system.

At a certain weight percentage of gold (Au) in the gold-tin (Au—Sn) solder layer (as illustrated by the phase equilibrium graphical representation for a gold-tin (Au—Sn) alloy system depicted in FIG. 4) the gold-tin (Au—Sn) solder layer transforms into zeta-phase and solidifies completely and a bond between the die and the substrate is formed.

The melting point of the bond is very high (e.g., 532 degrees Centigrade) as compared to the melting point commonly used to bond dies to substrates. As a result, the bond and die alignment are not disturbed when heating the substrate to bond subsequent dies. According to one embodiment of the present invention, when the weight percentage of gold (Au) in the gold-tin (Au—Sn) solder layer is approximately 88–90%wt, the solder layer transforms into zeta-phase and solidifies completely, and the bond between the substrate and the die is formed.

According to embodiments of the present invention, the die may not have a gold-tin (Au—Sn) solder layer on its die-bonding pad. Instead, the gold-tin (Au—Sn) solder layer is on the substrate-bonding pad. In this embodiment of the present invention, when heating, the temperature of the substrate is maintained below melting point of eutectic gold-tin (Au—Sn) solder to prevent a dramatic increase in diffuision of tin (Sn) into gold (Au) on the substrate-bonding pad. Thus, the die is heated to a temperature above the melting point of eutectic gold-tin (Au—Sn) solder. Additionally, the amount of gold (Au) on the substrate-bonding pad is not enough to transform the eutectic gold-tin (Au—Sn) solder from eutectic to zeta-phase. Rather, the combined amount of gold on the die-bonding pad and the substrate-bonding pad is sufficient to transform the eutectic gold-tin (Au—Sn) solder from eutectic to zeta-phase.

In alternative embodiments of the present invention, the eutectic gold-tin (Au—Sn) solder is disposed on the die-bonding pad and the substrate-bonding pad does not have eutectic gold-tin (Au—Sn) solder. In this embodiment of the present invention, when heating, the die-bonding pad is brought to a temperature that is slightly lower than the melting point of eutectic gold-tin (Au—Sn) solder and the substrate-bonding pad is brought to a temperature that is slightly higher than the melting point of eutectic gold-tin (Au—Sn) solder. Additionally, the amount of gold (Au) on the die-bonding pad is not sufficient to transform the eutectic gold-tin (Au—Sn) solder from eutectic to zeta-phase. However, the amount of gold (Au) on the substrate-bonding pad is sufficient to transform the eutectic gold-tin (Au—Sn) solder from eutectic to zeta-phase.

In other embodiments of the present invention, the eutectic gold-tin (Au—Sn) solder is disposed on the die-bonding pad and the substrate-bonding pad. In this embodiment of the present invention, either of the heating processes performed in the block 212 may be used to bond the die with the substrate.

In a block 214, the pick-up tool releases the die (e.g., the tool vacuum for the pick-up tool is turned "off") and the flip-chip bonder ceases the flow of hot inert (or forming) gas.

In a block 216, the bond between the die and the substrate cools and the method 200 repeats itself (e.g., returns to block 202) for the next die(s). For example, the eutectic Au—Sn solder layer, the die-bonding pad, and/or the substrate bonding-pad are heated to the melting point of eutectic Au—Sn. However, unlike prior art processes, the previously bonded die remains bonded to the substrate and aligned because the bond between the previously bonded die and the substrate melts at a temperature that is greater than eutectic Au—Sn eutectic temperature.

Of course, there may be other layer arrangements disposed in a multiple layer stack (i.e., instead of the die bonding pad, eutectic Au—Sn solder layer, and the substrate bonding pad arrangement). For example, the eutectic Au—Sn solder layer may be replaced by alternating layers of Sn and Au in predetermined weight ratios such that when melted the alternating layers of Au and Sn form a eutectic Au—Sn solder composition and when heated further form a zeta-phase composition of Au—Sn.

Additionally, a layer of titanium and a layer of platinum may be present in the bonding-pad structure. In this embodiment of the present invention, the structure of the bonding pad may be titanium over platinum over gold. In other embodiments of the present invention, other materials also may be used.

Figure 3:
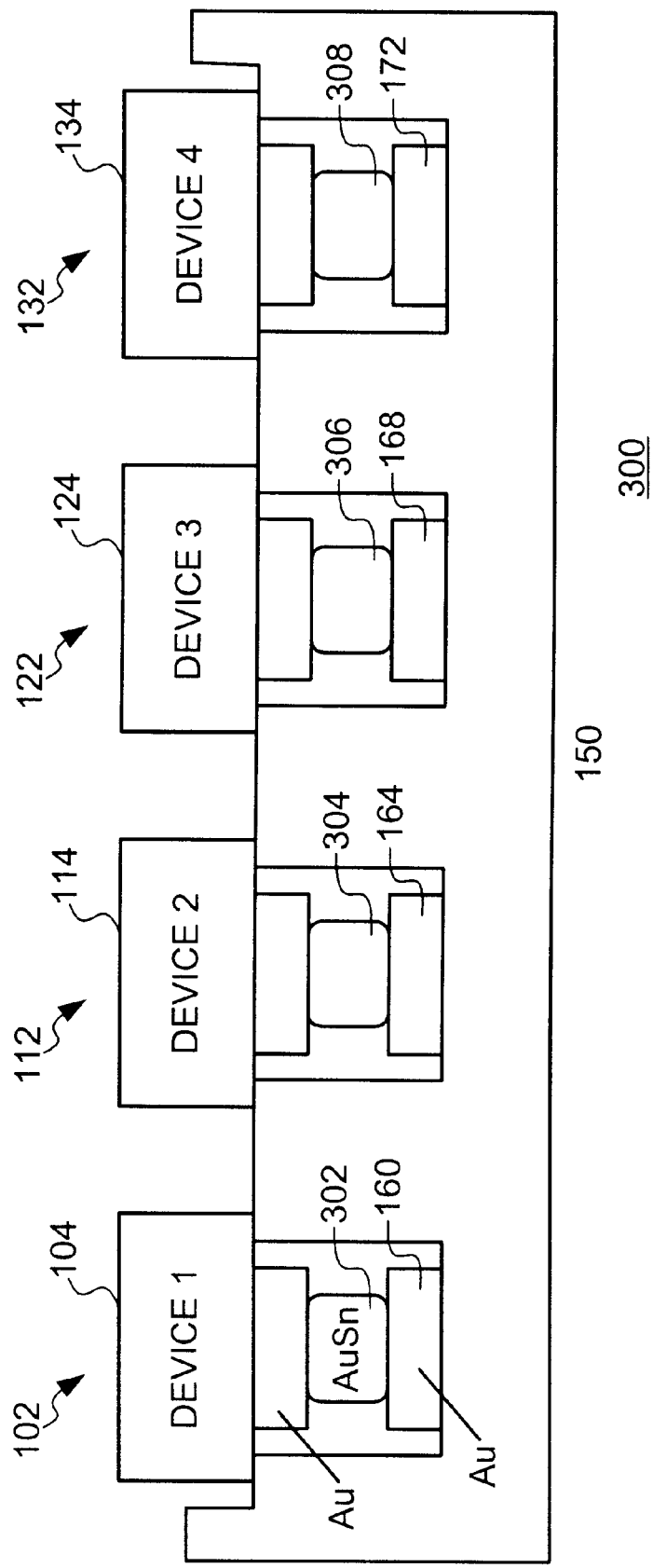
FIG. 3 is a cross-section view of a hybrid optical circuit after bonding active optoelectronic device dies to a substrate according to an embodiment of the present invention.

FIG. 3 a cross-section view of a hybrid optical circuit 100 after bonding the active optoelectronic device dies (102, 112, 122, 132) to the substrate 150 according to an embodiment of the present invention. In the embodiment of the present invention shown, the eutectic Au—Sn solder layers (108, 118, 128, 138) and the substrate bonding pads (106, 116, 126, 136) have been inter-diffused to create other Au—Sn compositions (302, 304, 306, 308, respectively), such as the zeta-phase Au—Sn composition whose composition is 88–90%wt of gold (Au) and 12–10%wt of tin (Sn) respectively, and whose subsequent melting temperature is greater than 500° Centigrade (approximately 532° Centigrade). Of course, the Au—Sn compositions (302, 304, 306, 308) may be made from the Au from the die bonding pads (160, 164, 168, 172), or Au from the die bonding pads (160, 164, 168, 172) and the substrate bonding pads (106, 116, 126, 136).

FIG. 4 is a graphical representation 400 of the phase equilibrium for a gold-tin (Au—Sn) alloy system, such as the system created by the eutectic Au—Sn solder layers (108, 118, 128, 138), the die bonding pads (106, 116, 126, 136), and the substrate bonding pads (160, 164, 168, 172). The graphical representation 400 illustrates that for a given weight ratio of Au to Sn, the Au—Sn alloy system will liquefy when it reaches a specific temperature. As the weight ratio of Au to Sn in the Au—Sn alloy system changes, the temperature at which the Au—Sn alloy system liquefies also changes.

The graphical representation 400 includes an "x" axis 402, which represent temperature in degrees centigrade, and a "y" axis, which represents the percentage of Sn in an Au—Sn alloy system. The graphical representation 400 also includes a (dotted line parabolic) curve 406, the area under which represents the zeta-phase of an Au—Sn alloy system. The graphical representation 400 illustrates that at a point 408 the Au—Sn alloy system is a eutectic composition, the percentage of approximately Sn is twenty and the percentage of Au is approximately eighty, and the melting temperature of the cooled compound (i.e., point of liquefaction) of such an Au—Sn system is approximately 278 degrees Centigrade. Interpretation of the graphical representation 400 is well known.

Figure 5:
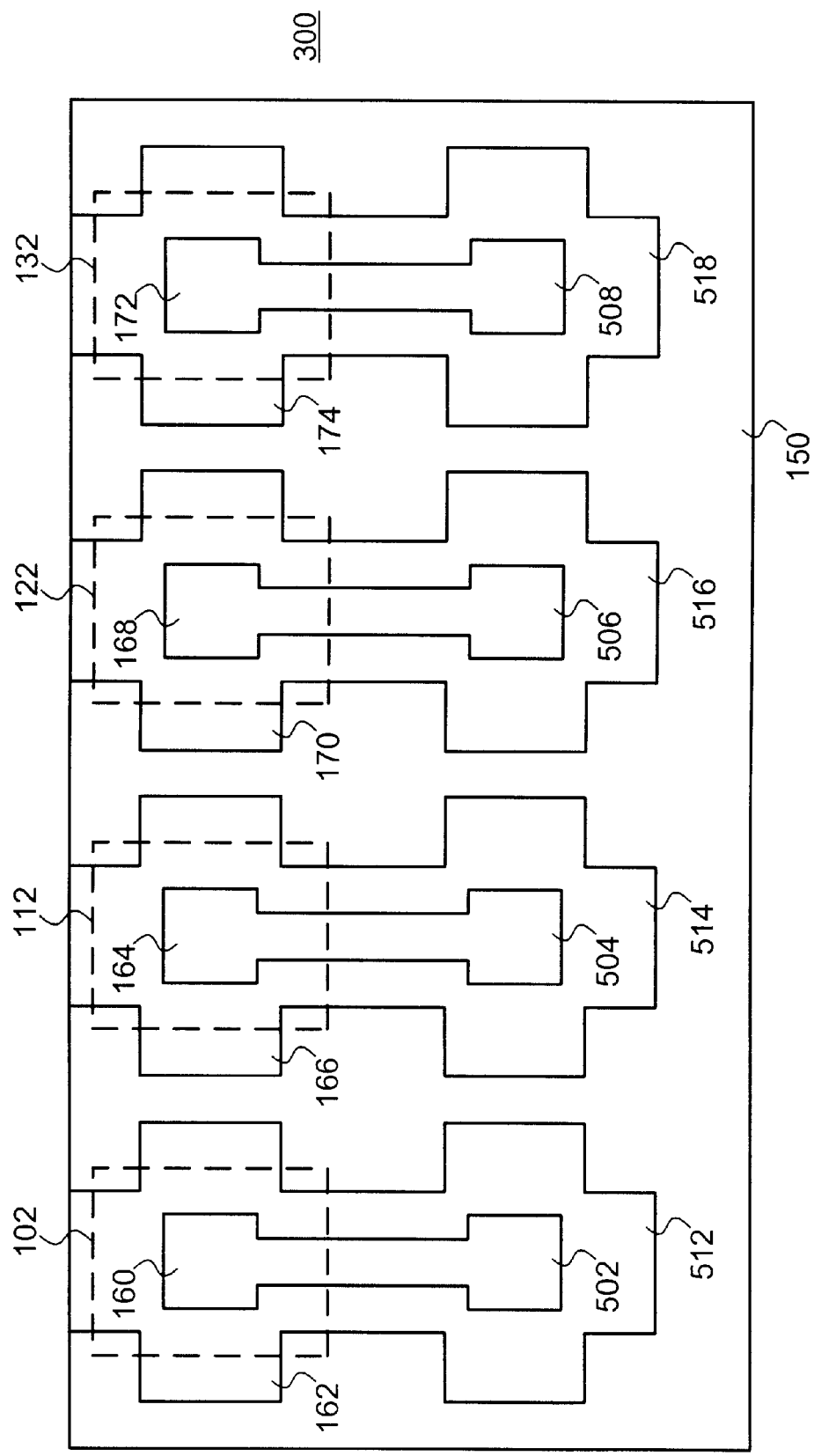
FIG. 5 is a top view of the layout of the flip-chip assembly of the hybrid optical circuit in FIG. 1 according to an embodiment of the present invention.

FIG. 5 is a top view of a hybrid optical circuit 500 according to an embodiment of the present invention, in which the substrate bonding pads (160, 164, 168, 172) are coupled to wire bonding pads (502, 504, 506, 508, respectively) located in substrate wells (512, 514, 516, 518, respectively). The wire bonding pads (502, 504, 506, 508) may include solder bumps, which electrically connect the active optoelectronic device dies (102, 112, 122, 132) to other circuitry on the substrate 150. The substrate wells 512, 514, 516, 518 may be formed in a manner similar to the substrate wells 162, 166, 170, 174.

In another embodiment, the wire bonding pads (502, 504, 506, 508) may be routed to the side of the substrate 150 to provide access to both edges of the active optoelectronic device dies (102, 112, 122, 132) so that light may be coupled from both edges of the active optoelectronic device dies (102, 112, 122, 132). This may be useful for applications in which optical waveguides are to be placed at the input and output of dies, in which optical fiber is to be placed at the input and output of dies, in which micro-optic components are to be placed at the input and output of dies (e.g., lens/isolators/diffraction gratings, etc.), and/or when other components, such as photodetector die/laser die, are to be placed at the input and output of dies.

According to an embodiment of the present invention, each optoelectronic device dies (102, 112, 122, 132) may be an optical amplifier (SOA) or any other optoelectronic die, thereby enables placement of multiple SOA/other optoelectronic die with high-precision and close proximity on the substrate, in order to realize arrays of device. Each die may be optimized to operate at a specific wavelength.

Figure 6:
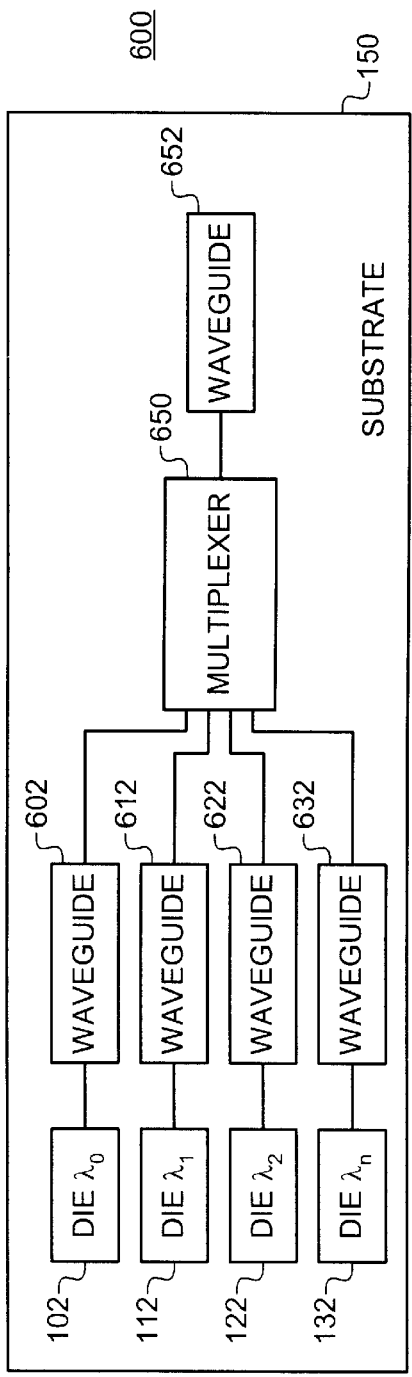
FIG. 6 is a block diagram of an optical power combiner according to an embodiment of the present invention.

FIG. 6 is a block diagram of a four-by-one optical power combiner 600 according to an alternative embodiment of the present invention, in which the active optoelectronic device (e.g., laser) dies 102, 112, 122, and 132 are bonded to the substrate 150 as described herein. The substrate 150 includes several waveguides (602, 612, 622, 632), which may be formed on the substrate 150 using reactive ion etching according to well known techniques. Each active optoelectronic device die (102, 112, 122, and 132) is aligned with a waveguide (602, 612, 622, 632, respectively) such that light from the active optoelectronic devices (104, 114, 124, 134, respectively) is efficiently coupled to its respective waveguide (602, 612, 622, 632, respectively).

Recall from above that in the prior art, light is coupled from separately packaged active optoelectronic devices into optical fibers and then coupled from the optical fibers to separately packaged waveguides on a substrate. According to an embodiment of the present invention, however, the light emitting portion of the active optoelectronic device dies 102, 112, 122, 132 may be directly coupled to the light transmitting portion of the waveguides 602, 612, 622, 632, respectively. Additionally, using the flip-chip bonder described above, placement to within one micron (±1 µm) accuracy may be achieved.

In one embodiment of the present invention, the operating wavelengths (or colors) of the active optoelectronic devices (104, 114, 124, 134) are dissimilar. The waveguides (602, 612, 622, 632) are coupled to a multiplexer 650, which multiplexes the different wavelengths into a single light signal. In alternative embodiment of the present invention, the multiplexer 650 may be a multimode interference (MMI) device or an arrayed waveguide grating (AWG) device. A waveguide 652, formed on the substrate 150 in a manner equivalent to the waveguides 602, 612, 622, 632, is coupled to the multiplexer 650 to direct the multiplexed light signal to other circuitry on or outside the optical power combiner 600.

Figure 7:
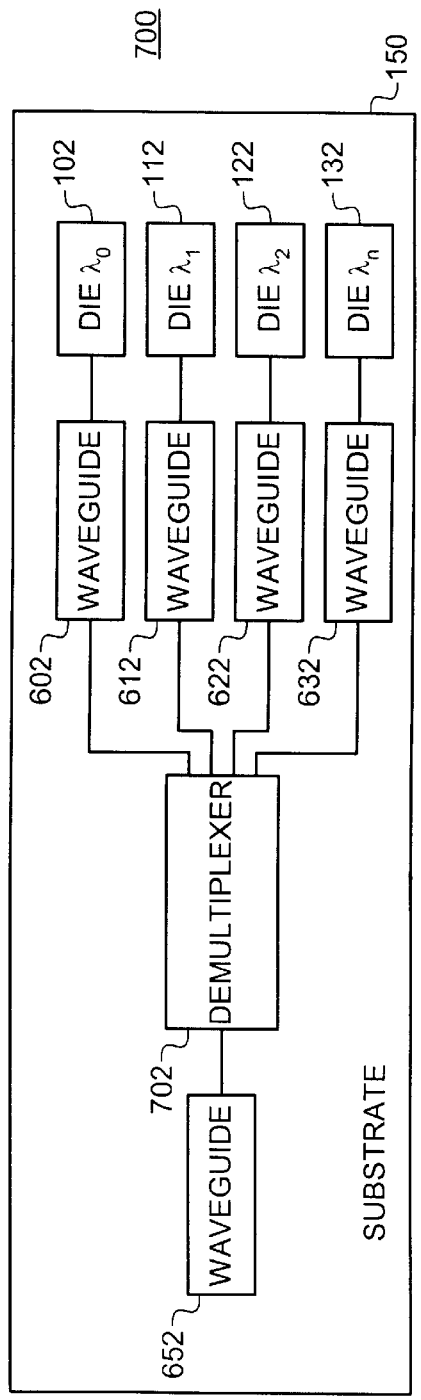
FIG. 7 is a block diagram of an optical wavelength division multiplexing (WDM) receiver according to an embodiment of the present invention.

FIG. 7 is a block diagram of a one-by-four WDM receiver module 700 according to an alternative embodiment of the present invention, in which the active optoelectronic device (e.g., photodetector) dies 102, 112, 122, and 132 are bonded to the substrate 150 as described herein. Each photodetector die (102, 112, 122, and 132) is aligned with a waveguide (602, 612, 622, 632, respectively) formed on the substrate 150 as described herein such that light from the waveguides is efficiently coupled to its respective photodetector (104, 114, 124, 134, respectively). Such a configuration would work optimally for an edge-illuminated photodetector. For surface illuminated photodetectors, other mechanical structures such as mirror/beam turner may be defined on the substrate 150 to direct the light from the optical waveguide/fiber into the photodetector aperture.

Although not so depicted, instead of coupling light between the photodetector dies 102, 112, 122, 132 and the waveguides 602, 612, 622, 632, respectively, using optical fibers, the light receiving portion of the photodetector dies 102, 112, 122, 132 may be efficiently coupled to the light transmitting portion of the waveguides 602, 612, 622, 632, respectively.

According to an embodiment of the present invention, the operating wavelengths (or colors) of the photodetectors (104, 114, 124, 134) are dissimilar. (Note: Resonantly enhanced photodetectors offer improved performance over a narrowband wavelength range. However, typical p-i-n type photodetectors offer a wide operating wavelength range of ~100 nm or so). The waveguides (602, 612, 622, 632) are coupled to a demultiplexer 702, which separates the different wavelengths out of a multiplexed light signal. A waveguide 652 is coupled to the demultiplexer 702 to direct the multiplexed light signal to the demultiplexer 702 from other circuitry on or outside of the optical WDM receiver module 700.

Figure 8:
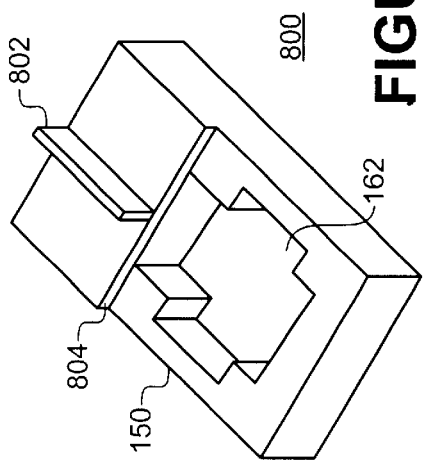
FIG. 8 is a perspective view of the substrate illustrated in FIG. 1 according to embodiments of the present.

FIG. 8 is a perspective view of a fragment 800 of the substrate 150 according to embodiments of the present invention. In the illustrated embodiment of the present invention, the substrate 150 includes a waveguide 802 and one of the substrate wells 162. An edge 804 defines the position of an active optoelectronic device die in the "z" direction. The waveguide 802 may be formed in the second intrinsic Si layer, by dry etching to remove all but selective portions of the second intrinsic Si layer, for example.

Figure 9:
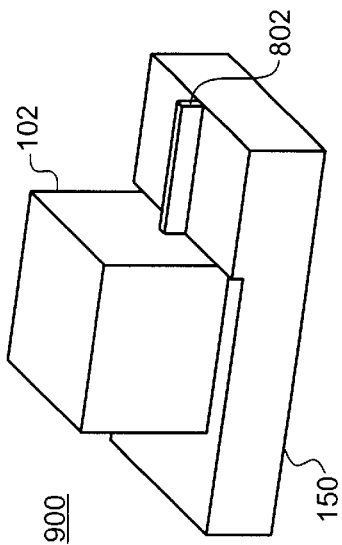
FIG. 9 is a perspective view of a fragment of the hybrid optical circuit illustrated in FIG. 1 according to embodiments of the present invention.

FIG. 9 is a perspective view of a fragment 900 of the substrate 150 according to embodiments of the present invention. FIG. 9 shows one of the active optoelectronic device dies 102 bonded to a substrate-bonding pad disposed inside the substrate well 162 and aligned to the waveguide 802 in accordance with embodiments of the present invention.

Embodiments of the invention can be implemented using hardware, software, or a combination of hardware and software. Such implementations include state machines and application specific integrated circuits (ASICs). In implementations using software, the software may be stored on a computer program product (such as an optical disk, a magnetic disk, a floppy disk, etc.) or a program storage device (such as an optical disk drive, a magnetic disk drive, a floppy disk drive, etc.).

The above description of illustrated embodiments of the invention is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize. These modifications can be made to the invention in light of the above detailed description.

The terms used in the following claims should not be construed to limit the invention to the specific embodiments of the present invention disclosed in the specification and the claims. Rather, the scope of the invention is to be determined entirely by the following claims, which are to be construed in accordance with established doctrines of claim interpretation.

What is claimed is:

1. A method, comprising:

heating a first active optoelectronic device die and a substrate to form a first zeta-phase composition of a gold-tin (Au—Sn) solder from a first eutectic Au—Sn solder layer disposed between the first active optoelectronic device die and the substrate;

cooling the first zeta-phase composition of a gold-tin (Au—Sn) solder to bond the first active optoelectronic device die and to the substrate; and heating a second active optoelectronic device die and the substrate to form a second zeta-phase composition of a gold-tin (Au—Sn) solder from a second eutectic Au—Sn solder layer disposed between the second active optoelectronic device die and the substrate, the first active optoelectronic device die remaining bonded to the substrate during heating of the second active optoelectronic device die.

2. The method of claim 1, wherein heating the active optoelectronic device die and the substrate to form the zeta-phase composition of a Au—Sn solder comprises heating the active optoelectronic device die and the substrate to form an 88–90%wt/12–10%wt Au—Sn solder composition.

3. The method of claim 2, wherein heating the active optoelectronic device die and the substrate to form an 88–90%wt/12–10%wt Au—Sn solder composition comprises diffusing a predetermined amount of Sn from the eutectic Au—Sn solder into a substrate gold (Au) bonding pad or an active optoelectronic device die Au bonding pad.

4. The method of claim 1, wherein heating the active optoelectronic device die and the substrate to form the zeta-phase composition of a Au—Sn solder comprises heating the active optoelectronic device die and a silicon-on-insulator (SOI) substrate.

5. The method of claim 2, wherein heating the active optoelectronic device die and the substrate to form the zeta-phase composition of an Au—Sn solder comprises wherein heating a laser die.

6. The method of claim 1, wherein heating the active optoelectronic device die and the substrate to form the zeta-phase composition of a Au—Sn solder comprises heating a bottom surface of the substrate and heating a bottom surface of the die using a flip-chip bonder.

7. A method, comprising:

heating a first active optoelectronic device die and a substrate to form a first composition of a gold-tin (Au—Sn) solder from a first eutectic Au—Sn solder composition disposed between the first active optoelectronic device die and the substrate whose melting temperature is greater than an eutectic temperature of the first eutectic Au—Sn solder composition disposed between the first active optoelectronic device die and the substrate;

cooling the first zeta-phase composition of a gold-tin (Au—Sn) solder to bond the first active optoelectronic device die and to the substrate; and heating a second active optoelectronic device die and the substrate to form a second composition of a gold-tin (Au—Sn) solder from a second eutectic Au—Sn solder composition disposed between the second active optoelectronic device die and the substrate whose melting temperature is greater than an eutectic temperature of the second eutectic Au—Sn solder composition disposed between the second active optoelectronic device die and the substrate.

8. The method of claim 7, wherein heating the active optoelectronic device die and the substrate to form the composition of a Au—Sn solder whose melting temperature is greater than the eutectic temperature of the eutectic Au—Sn solder composition comprises heating the active optoelectronic device die and the substrate to form an Au—Sn solder composition whose melting temperature is greater than approximately two hundred seventy-eight degrees Centigrade.

9. The method of claim 7, further comprising cooling the composition of a Au—Sn solder whose melting temperature is greater than the eutectic temperature of the eutectic Au—Sn solder composition.

10. The method of claim 9, further comprising heating a second active optoelectronic device die and the substrate to form a second composition of a gold-tin (Au—Sn) solder from a second eutectic Au—Sn solder composition disposed between the second active optoelectronic device die and the substrate whose melting temperature is greater than the eutectic temperature of the second eutectic Au—Sn solder composition disposed between the second active optoelectronic device die and the substrate.

11. The method of claim 10, wherein heating the first and second active optoelectronic device dies and the substrate to form the zeta-phase composition of a Au—Sn solder comprises heating a first and a second laser die having a first and a second operating wavelength at a first and a second point in time, respectively.

12. A method, comprising:

heating a first active optoelectronic device die comprising a first gold-layered die bonding pad and a substrate having a first gold-layered substrate bonding pad disposed in a first well of the substrate to a melting temperature of a first eutectic Au—Sn solder layer disposed between the first gold-layered die bonding pad and the first gold-layered substrate bonding pad;

heating the active optoelectronic device die and the substrate to form a zeta-phase composition of Au—Sn solder from the eutectic Au—Sn solder layer;

cooling the zeta-phase composition of a gold-tin (Au—Sn) solder to bond the first active optoelectronic device die and to the substrate; and heating a second active optoelectronic device die and the substrate to form a second zeta-phase composition of a gold-tin (Au—Sn) solder from a second eutectic Au—Sn solder layer disposed between the second active optoelectronic device die and the substrate, the first active optoelectronic device die remaining bonded to the substrate during heating of the second active optoelectronic device die.

13. The method of claim 12, wherein heating the active optoelectronic device die and the substrate to form the zeta-phase composition of Au—Sn solder comprises heating the active optoelectronic device die and the substrate to form an 88–90%wt/12–10%wt Au—Sn solder composition.

14. The method of claim 13, wherein heating the active optoelectronic device die and the substrate to form an 88–90%wt/12–10%wt Au—Sn solder composition comprises heating the active optoelectronic device die and the substrate to form an Au—Sn solder composition whose melting temperature is greater than approximately two hundred seventy-eight degrees Centigrade.

15. A method, comprising:

heating a substrate to a first temperature;

heating a photonic device die to a second temperature;

aligning the photonic device die to an alignment position on the substrate;

bringing the substrate and the photonic device die into contact with an eutectic composition of gold-tin (Au—Sn) solder disposed between the substrate and the photonic device die;

transforming the eutectic composition of Au—Sn solder to a zeta-phase composition of gold-tin (Au—Sn) solder and bonding the photonic device to the substrate; and heating a second photonic device die and the substrate to a second temperature, the first photonic device remaining bonded to the substrate during heating of the second photonic device.

16. The method of claim 15, wherein heating a substrate to a first temperature comprises positioning the substrate on a bottom chuck of a flip-chip bonder.

17. The method of claim 16, wherein heating a photonic device die to a second temperature comprises picking up the photonic device die using a flip-chip bonder heated pick-up tool.

18. The method of claim 15, wherein heating a substrate to a first temperature comprises applying at least one of an inert gas or forming gas to the substrate.

19. The method of claim 15, wherein bringing the substrate and the photonic device die into contact with an eutectic composition of gold-tin (Au—Sn) solder disposed between the substrate and the photonic device die comprises applying a small force to the photonic device die via a flip-chip bonder bonding arm.

20. The method of claim 15, further comprising micro-machining mechanical stops in or on the substrate.

21. The method of claim 15, wherein aligning the photonic device die to an alignment position on the substrate comprises aligning a photonic device on the photonic device die to a waveguide formed in or on the substrate.

* * * * *

UNITED STATES PATENT AND TRADEMARK OFFICE
CERTIFICATE OF CORRECTION

PATENT NO.      : 6,660,548 B2
DATED           : December 9, 2003
INVENTOR(S)     : Naydenkov et al.

It is certified that error appears in the above-identified patent and that said Letters Patent is hereby corrected as shown below:

<u>Column 4,</u>
Line 22, delete "substrated-bonding", insert -- substrate-bonding --.

Signed and Sealed this

Twenty-fourth Day of February, 2004

JON W. DUDAS
*Acting Director of the United States Patent and Trademark Office*